United States Patent
Lee et al.

(10) Patent No.: US 11,191,163 B2
(45) Date of Patent: Nov. 30, 2021

(54) FLEXIBLE PRINTED CIRCUIT BOARD AND FLEXIBLE DISPLAY MODULE AND ELECTRONIC DEVICE COMPRISING THE SAME

(71) Applicant: LG Display Co., Ltd., Seoul (KR)

(72) Inventors: TaeWoo Lee, Paju-si (KR); HeeSeok Noh, Paju-si (KR); Sungwook Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/706,488

(22) Filed: Dec. 6, 2019

(65) Prior Publication Data
US 2020/0196452 A1 Jun. 18, 2020

(30) Foreign Application Priority Data
Dec. 17, 2018 (KR) .................. 10-2018-0163153

(51) Int. Cl.
*H05K 1/00* (2006.01)
*H05K 1/18* (2006.01)
*G06F 3/041* (2006.01)

(52) U.S. Cl.
CPC .......... *H05K 1/189* (2013.01); *G06F 3/0412* (2013.01); *H05K 2201/09372* (2013.01); *H05K 2201/10128* (2013.01)

(58) Field of Classification Search
CPC ......... H05K 1/189; H05K 2201/09372; H05K 2201/10128; G06F 3/0412
See application file for complete search history.

(56) References Cited

U.S. PATENT DOCUMENTS

| | | | | |
|---|---|---|---|---|
| 8,853,547 B2 * | 10/2014 | Voegerl | ................. | H05K 1/118 174/254 |
| 8,885,299 B1 * | 11/2014 | Bennin | ............... | G11B 5/4833 360/294.3 |
| 2004/0246626 A1 * | 12/2004 | Wakaki | ................. | H05K 3/363 360/245.8 |
| 2007/0254117 A1 * | 11/2007 | Graydon | ............... | H05K 1/118 428/34.1 |
| 2009/0290279 A1 * | 11/2009 | Rodgriguez | ............. | A61N 1/14 361/220 |
| 2016/0073498 A1 * | 3/2016 | Yeo | ........................ | H05K 1/111 361/748 |
| 2017/0176835 A1 * | 6/2017 | Gupta | ................... | G02F 1/1679 |
| 2018/0217465 A1 * | 8/2018 | Nagata | .............. | G02F 1/133514 |

* cited by examiner

*Primary Examiner* — Pete T Lee
(74) *Attorney, Agent, or Firm* — Fenwick & West LLP

(57) ABSTRACT

A flexible printed circuit board with improved ground efficiency is disclosed, and a flexible display module and an electronic device comprising the same is disclosed, wherein the flexible printed circuit board comprises a flexible circuit film having a circuit layer disposed on one surface of a base film, and a ground pad portion disposed on another surface of the base film; and a conductive cover member configured to cover the other surface of the base film and electrically connected with the ground pad portion, wherein the conductive cover member includes a cutting portion overlapped with the ground pad portion.

14 Claims, 6 Drawing Sheets

FLEXIBLE PRINTED CIRCUIT BOARD AND FLEXIBLE DISPLAY MODULE AND ELECTRONIC DEVICE COMPRISING THE SAME

CROSS-REFERENCE TO RELATED APPLICATIONS

This application claims the benefit of Republic of Korea Patent Application No. 10-2018-0163153 filed on Dec. 17, 2018, which is hereby incorporated by reference herein its entirety.

BACKGROUND

Technical Field

The present disclosure relates to a flexible printed circuit board and a flexible display module and an electronic device comprising the same.

Discussion of the Related Art

A flexible printed circuit board is a circuit board capable of being bent, which is used as a main element in an electronic device such as a television, a monitor, a notebook computer, a smart phone, a tablet computer, a wearable device, a watch phone, a mobile information device, a navigation or a vehicle control display device.

Generally, the flexible printed circuit board may include a deposition structure comprising a copper clad pattern circuit layer provided on an upper surface and/or a lower surface of a base film having flexibility and insulating properties such as polyimide, and a cover layer (or coverlay) configured to cover the copper clad pattern circuit layer.

The related art flexible printed circuit board includes a ground pad (or pattern) exposed to the external so as to protect a circuit from externally-introduced static electricity. However, the discharge of static electricity is made only through the ground pad so that it has limitations on improvement of ground function. According as the static electricity is not smoothly discharged, it has limitations on protection of circuit components.

SUMMARY

Accordingly, the present disclosure is directed to providing a flexible printed circuit board and a flexible display module and an electronic device comprising the same that substantially obviates one or more problems due to limitations and disadvantages of the related art.

An aspect of the present disclosure is directed to providing a flexible printed circuit board with an improved ground function, and a flexible display module and an electronic device comprising the same.

Additional features and aspects will be set forth in the description that follows, and in part will be apparent from the description or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other advantages and in accordance with the purpose of the disclosure, as embodied and broadly described herein, there is provided a flexible printed circuit board comprising a flexible circuit film having a circuit layer disposed on one surface of a base film, and a ground pad portion disposed on another surface of the base film; and a conductive cover member configured to cover the other surface of the base film and electrically connected with the ground pad portion, wherein the conductive cover member includes a cutting portion overlapped with the ground pad portion.

In another aspect of the present disclosure, there is provided a flexible display module comprising a flexible display panel having a display pad portion and a touch pad portion; and a display driving circuit portion having a flexible circuit board connected with the display pad portion, and a touch flexible circuit film connected with the touch pad portion, wherein at least one of the flexible circuit board and the touch flexible circuit film includes a flexible printed circuit board, wherein the flexible printed circuit board includes a flexible circuit film having a circuit layer disposed on one surface of a base film, and a ground pad portion disposed on another surface of the base film; and a conductive cover member configured to cover the other surface of the base film and electrically connected with the ground pad portion, wherein the conductive cover member includes a cutting portion overlapped with the ground pad portion.

In another aspect of the present disclosure, there is provided an electronic device comprising a cover window; a flexible display module, connected with the cover window; and a display driving circuit portion connected with the flexible display module, wherein the flexible display module comprises a flexible display panel having a display pad portion and a touch pad portion; and a display driving circuit portion having a flexible circuit board connected with the display pad portion, and a touch flexible circuit film connected with the touch pad portion, wherein at least one of the flexible circuit board and the touch flexible circuit film includes a flexible printed circuit board, wherein the flexible printed circuit board includes a flexible circuit film having a circuit layer disposed on one surface of a base film, and a ground pad portion disposed on another surface of the base film; and a conductive cover member configured to cover the other surface of the base film and electrically connected with the ground pad portion, wherein the conductive cover member includes a cutting portion overlapped with the ground pad portion.

According to one or more embodiments of the present disclosure, a ground function is improved so that it is possible to provide a flexible printed circuit board capable of preventing circuit components from being damaged by static electricity, and a flexible display module and an electronic device comprising the same.

In addition to the objects of the present disclosure as mentioned above, additional objects of the present disclosure will be clearly understood by those skilled in the art from the following description of the present disclosure.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this application, illustrate embodiments of the disclosure and together with the description serve to explain various principles of the disclosure.

DETAILED DESCRIPTION

Figure 1:
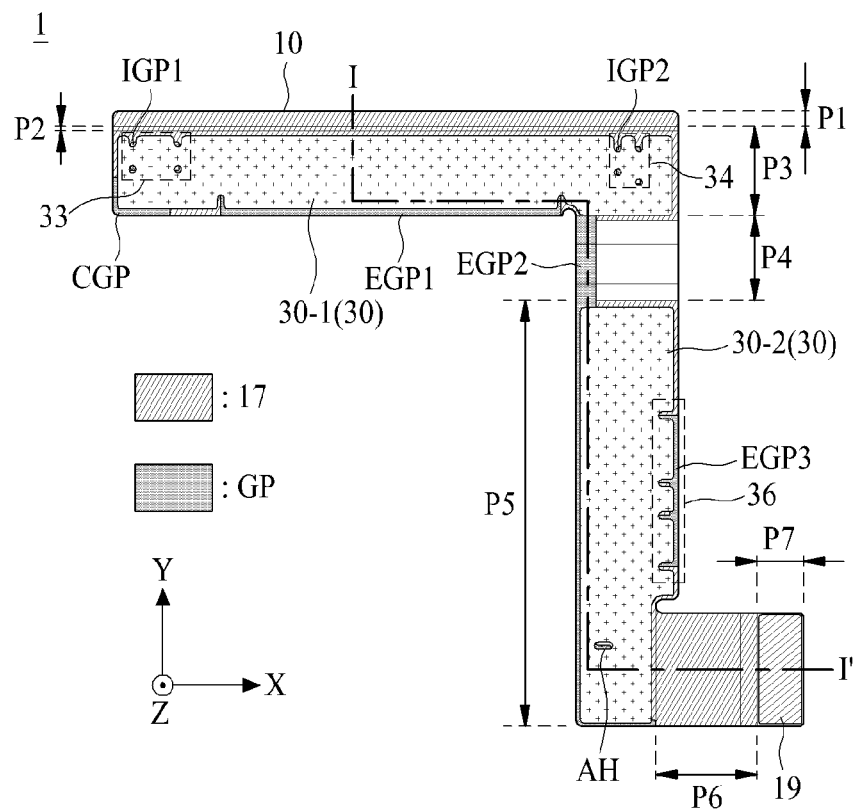
FIG. 1 illustrates a flexible printed circuit board according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when one element is described as 'upon~', 'above', 'below~', and 'next to~' another element, one or more portions may be arranged between the two elements unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, a flexible printed circuit board and a flexible display module and an electronic device comprising the same according to the present disclosure will be described in detail with reference to the accompanying drawings. In the specification, in adding reference numerals for elements in each drawing, it should be noted that like reference numerals already used to denote like elements in other drawings are used for elements wherever possible. In the following description, when the detailed description of the relevant known function or configuration is determined to unnecessarily obscure the important point of the present disclosure, the detailed description will be omitted.

Figure 2:
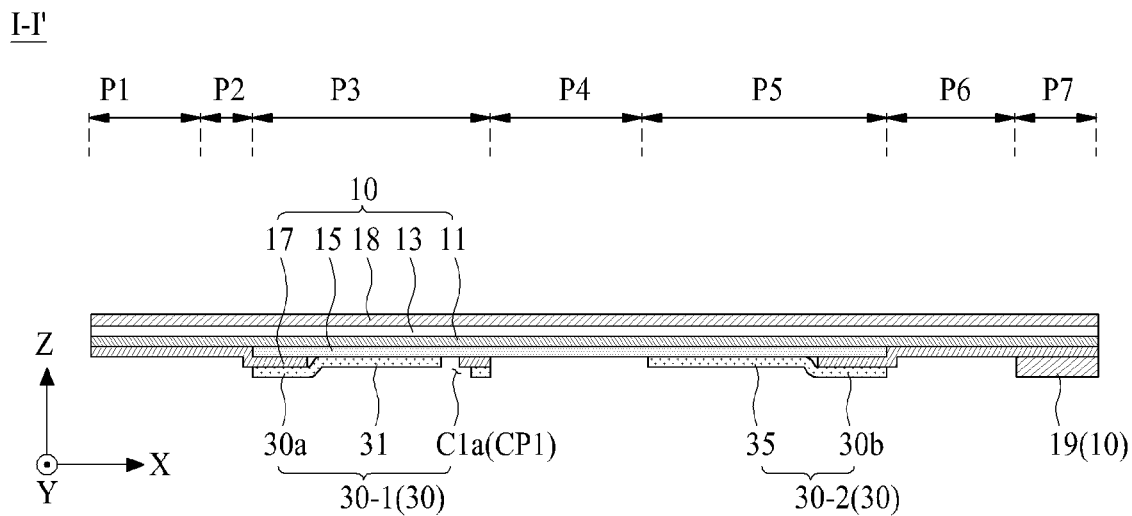
FIG. 2 is a cross-sectional view taken along line I-I' of FIG. 1 according to one embodiment of the present disclosure.

FIG. 1 illustrates a flexible printed circuit board according to one embodiment of the present disclosure. FIG. 2 is a cross-sectional view taken along line I-I' of FIG. 1. Herein, a scale of the flexible printed circuit board illustrated in FIGS. 1 and 2 is not a 1:1 scale of the flexible printed circuit board for convenience of explanation, whereby it is not limited to the scale illustrated in the drawings.

Referring to FIGS. 1 and 2, the flexible printed circuit board 1 according to one embodiment of the present disclosure may include a flexible circuit film 10 and a conductive cover member 30.

The flexible circuit film 10 may include a bonding pad portion P1, a first bending portion P2, a first body portion P3, a second bending portion P4, a second body portion P5, a third bending portion P6, and a connector portion P7.

The bonding pad portion P1 may be electrically connected with another circuit board of the electronic device. For example, the bonding pad portion P1 may be electrically connected with a touch pad portion or a display pad portion of a display module. In this case, the bonding pad portion P1 may be electrically connected with the touch pad portion or the display pad portion of the display module by a film attachment process using an anisotropic conductive film. The bonding pad portion P1 according to one embodiment of the present disclosure may have a first length that is parallel to a first direction X, and a second length that is parallel to a second direction Y which is perpendicular to the first direction X.

Each of the first body portion P3 and the second body portion P5 may have a predetermined length, wherein each of the first body portion P3 and the second body portion P5 may include circuit lines and various electronic components (or circuits) mounted by a surface mounting technology. The first body portion P3 according to one embodiment of the present disclosure may have a first length that is parallel to the first direction X, and a second length that is parallel to the second direction Y. The second body portion P5 according to one embodiment of the present disclosure may have a third length that is parallel to the first direction X, and a fourth length that is parallel to the second direction Y. In this case, the third length of the second body portion P5 may be shorter than the first length of the first body portion P3, and the fourth length of the second body portion P5 may be longer than the second length of the first body portion P3.

The connector portion P7 may be electrically connected with a host control board of the electronic device, or a connector terminal mounted on a main printed circuit board. The connector portion P7 according to one embodiment of the present disclosure may have a fifth length that is parallel to the first direction X, and a sixth length that is parallel to the second direction Y.

The first bending portion P2 may be bendably connected between the bonding pad portion P1 and the first body portion P3. The first bending portion P2 enables the bending of the first body portion P3 from the bonding pad portion P1.

A thickness of the first bending portion P2 may be relatively smaller than a thickness of the first body portion P3. In this case, the first body portion P3 may be bent with easiness from the bonding pad portion P1. Accordingly, owing to the first bending portion P2 whose thickness is relatively smaller than that of the first body portion P3, the flexible printed circuit board 1 may be easily bent even in case of a physical contact with an external structure so that it is possible to prevent the flexible printed circuit board 1 from being damaged by the forcible bending (or folding or breaking) on the physical contact with the external structure.

The second bending portion P4 may be bendably connected between the first body portion P3 and the second body portion P5. The second bending portion P4 enables the bending of the second body portion P5 from the first body portion P3. Selectively, it is possible to omit the second bending portion P4. In this case, the second body portion P5 having a predetermined length and width may extend from one side of the first body portion P3. For example, the first body portion P3, the second bending portion P4 and the second body portion P5 may be connected in a two-dimensional structure of "]" shape with one another.

The third bending portion P6 may be bendably connected between the second body portion P5 and the connector portion P7. The third bending portion P6 enables the bending of the connector portion P7 from the second body portion P5. For example, the second body portion P5, the third bending portion P6 and the connector portion P7 may be connected in a two-dimensional structure of "[" shape with one another.

The flexible circuit film 10 according to one embodiment of the present disclosure may include a base film (or a base member) 11, a circuit layer 13, a ground plate 15, and a cover layer 17.

The base film 11 may include the bonding pad portion P1, the first bending portion P2, the first body portion P3, the second bending portion P4, the second body portion P5, the third bending portion P6, and the connector portion P7. The base film 11 according to one embodiment of the present disclosure may be a plastic film, for example, polyimide (PI) film.

The circuit layer 13 may be disposed on at least one of one surface (or front surface) and the other surface (or rear surface) of the base film 11. For example, the circuit layer 13 may include a copper clad lamination structure or a flexible copper clad lamination structure.

The circuit layer 13 according to one embodiment of the present disclosure may include a first circuit line layer disposed on one surface of the base film 11. The first circuit line layer may include a plurality of first circuit lines disposed on one surface of the base film 11 and configured to have the copper clad lamination or flexible copper clad lamination structure. For example, the first circuit line layer includes a copper clad layer attached to one surface of the base film 11 by the use of adhesive layer, whereby the first circuit line layer has a dual-layered structure comprising the adhesive layer and the copper clad layer.

The circuit layer 13 according to one embodiment of the present disclosure may further include a second circuit line layer disposed on the other surface of the base film 11. The second circuit line layer may include a plurality of second circuit lines disposed on the other surface of the base film 11 and configured to have the copper clad lamination structure or flexible copper clad lamination structure. For example, the second circuit line layer includes a copper clad layer attached to one surface of the base film 11 by the use of an adhesive layer, whereby the second circuit line layer has a dual-layered structure comprising the adhesive layer and the copper clad layer. Additionally, at least some among the plurality of second circuit lines disposed in the second circuit line layer may be electrically connected with at least one among the plurality of first circuit lines disposed in the first circuit line layer through a via hole or contact hole penetrating through the base film 11. The second circuit line layer may be omitted.

The ground plate 15 may be disposed on the other surface of the base film 11. The ground plate 15 according to one embodiment of the present disclosure may be disposed on the other surface of the base film 11 while being overlapped with the first body portion P3, the second bending portion P4, and the second body portion P5. In this case, the ground plate 15 may be attached onto the other surface of the base film 11 or the second circuit line layer by the use of an adhesive.

The cover layer 17 covers the remaining portions except a ground pad portion GP defined on the other surface of the base film 11, so that it is possible to protect or insulate an exposed surface of the ground plate 15. For example, the cover layer 17 may include PI material or solder resist material. In another way, the cover layer 17 may include photo imagable solder resist, and may be green color, but the present disclosure is not limited thereto.

The cover layer 17 according to one embodiment of the present disclosure covers the other surface (or second circuit line layer) of the base film 11 and the remaining portions of the ground plate 15 except a ground pad area defined on the ground plate 15, whereby it is possible to expose the ground pad area defined on the ground plate 15. Accordingly, the ground pad area of the ground plate 15, which is exposed to the external without being covered by the cover layer 17, may be used as the ground pad portion GP.

Figure 3:
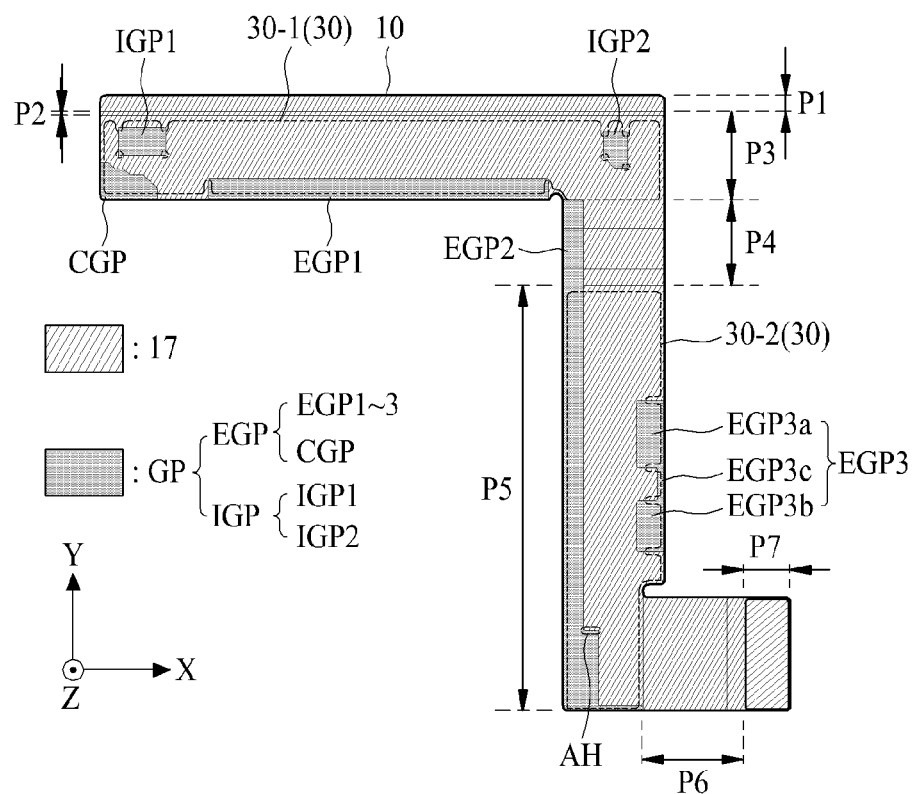
FIG. 3 illustrates a ground pad portion illustrated in FIG. 1 according to one embodiment of the present disclosure.

The ground pad portion GP according to one embodiment of the present disclosure may include at least one edge ground pad EGP disposed in the edge portion of the other surface of the base film 11. For example, the ground pad portion GP may include a first edge ground pad EGP1 exposed to the first edge portion of the first body portion P3, a corner ground pad CGP exposed to the first corner portion of the first body portion P3, a second edge ground pad EGP2 disposed in the first and second edge portions of the second body portion P5, and a third edge ground pad EGP3 disposed in the fourth edge portion of the second body portion P5, as illustrated in FIG. 3. In this case, the first edge ground pad EGP1 may be disposed in the lower edge portion of the first body portion P3, and the corner ground pad CGP may be disposed in the corner portion between the lower side of the first body portion P3 and the left side of the first body portion P3. The second edge ground pad EGP2 may be disposed over the lower and left edge portions of the second body portion P3, and may be additionally disposed in the second edge portion of the second bending portion P4. The third edge ground pad EGP3 may be disposed in the right edge portion of the second body portion P3.

The first edge ground pad EGP1 may have a plane structure of a rectangular shape comprising a long side being parallel to the first direction X, and a short side being parallel to the second direction Y.

The corner ground pad CGP may have a right-angled triangle shape.

The second edge ground pad EGP2 may have a plane structure of "L" shape or polygonal shape comprising a long side being parallel to the second direction Y and a short side being parallel to the first direction X.

The third edge ground pad EGP3 according to one embodiment of the present disclosure may have a plane structure of a rectangular shape comprising a long side being parallel to the second direction Y, and a short side being parallel to the first direction X.

The third edge ground pad EGP3 according to another embodiment of the present disclosure may have a plane structure of "⊃" shape. For example, the third edge ground pad EGP3 according to another embodiment of the present disclosure may include a first pad pattern EGP3a disposed in the right edge portion of the second body portion P3, a second pad pattern EGP3b that is parallel to the first pad pattern EGP3a, and a pad connection pattern EGP3c configured to connect the first pad pattern EGP3a and the second pad pattern EGP3b with each other.

The ground pad portion GP according to one embodiment of the present disclosure may further include at least one island ground pad IGP. For example, the ground pad portion GP may include a first island ground pad IGP1 disposed in the second corner portion (or left upper edge portion) of the first body portion P3, and a second island ground pad IGP2 disposed in the third corner portion (or right upper edge portion) of the first body portion P3. In this case, each of the first and second island ground pads IGP1 and IGP2 may have a plane structure of a rectangular shape.

Referring one again to FIGS. 1 and 2, the flexible circuit film 10 according to one embodiment of the present disclosure may further include a coating layer 18 disposed on one surface of the base film 11.

The coating layer 18 may be disposed on one surface of the base film 11, and is configured to cover the circuit layer 13. The coating layer 18 according to one embodiment of the present disclosure may protect or insulate the exposed surface of the circuit layer 13. For example, the coating layer 18 may be a complex film comprising a PI film, and a thermo-curing epoxy adhesive coated onto one surface of the PI film. In another way, the coating layer 18 may be a complex film comprising a PI film, a thermo-curing epoxy adhesive coated onto one surface of the PI film, and a black adhesive (or black PI film) formed on the other surface of the PI film. Also, in another way, the coating layer 18 may include photo imagable solder resist, and may be green color, but the present disclosure is not limited thereto.

The flexible circuit film 10 according to one embodiment of the present disclosure may further include a stiffener 19 which is disposed on the cover layer 17 overlapped with the connector portion P7. The stiffener 19 may reinforce a stiffness of the connector portion P7. The stiffener 19 according to one embodiment of the present disclosure may include PET (polyethyleneterephthalate), PI (polyimide), or epoxy.

The conductive cover member 30 is disposed on the other surface of the base film 11, and may be electrically connected with the ground pad portion GP. For example, the conductive cover member 30 may be attached to the other surface of the base film 11 and the ground pad portion GP. The conductive cover member 30 according to one embodiment of the present disclosure may include a cover base film, a thin film metal layer disposed onto and combined with the cover base film, and a conductive adhesive layer disposed onto and combined with the thin film metal layer. In this case, the conductive cover member 30 may be attached to the other surface of the base film 11 and the ground pad portion GP by the use of conductive adhesive layer. As the conductive cover member 30 covers the other surface of the base film 11 and is electrically connected with the ground pad portion GP, a ground area of the flexible circuit film 10 is increased so that it enables the smooth collection and discharge of the static electricity. Accordingly, it is possible to improve a ground function of the flexible printed circuit board 1, and to prevent the circuit components from being damaged by the static electricity.

The conductive cover member 30 may include a cutting portion CP which is overlapped with the ground pad portion GP exposed to the other surface of the base film 11.

As illustrated in FIGS. 1 to 4, the cutting portion CP according to one embodiment of the present disclosure may include first to fourth cutting portions CP1, CP2, CP3, and CP4 respectively overlapped with the first edge ground pad EGP1, the first island ground pad IGP1, the second island ground pad IGP2, and the third edge ground pad EGP3 disposed to the other surface of the base film 11.

The first cutting portion CP1 may be overlapped with the boundary between the cover layer 17 and the first edge ground pad EGP1 exposed to the other surface of the base film 11. The first cutting portion CP1 according to one embodiment of the present disclosure may include a pair of first cutting lines (or first slits) C1a and C1b.

The one pair of first cutting lines (or first slits) C1a and C1b may be disposed on the boundary between the first edge ground pad EGP1 and the cover layer 17, wherein each of the first cutting lines C1a and C1b may have a width of 0.5 mm or more than 0.5 mm being parallel to the first direction X, and a predetermined length being parallel to the second direction Y. In this case, the boundary between the first edge ground pad EGP1 and the cover layer 17 may be positioned in the center of the first cutting lines C1a and C1b constituting one pair. The one pair of first cutting lines C1a and C1b enables to increase an adhesion area between the conductive cover member 30 and the first edge ground pad EGP1 or to improve an adhesiveness (or adhesion) between the conductive cover member 30 and the first edge ground pad EGP1 in accordance with a step difference (or thickness difference) between the first edge ground pad EGP1 and the cover layer 17 so that it is possible to prevent an antistatic function from being deteriorated by a separation or non-adhesion between the conductive cover member 30 and the first edge ground pad EGP1. Also, the one pair of first cutting lines C1a and C1b may expose the boundary between the first edge ground pad EGP1 and the cover layer 17 to the external, whereby the one pair of first cutting lines C1a and C1b may serve as an align mark configured to align the conductive cover member 30 and the first edge ground pad EGP1 for an attachment process of the conductive cover member 30.

For example, any one of the first cutting lines C1a and C1b constituting one pair may be overlapped with the boundary between the cover layer 17 and one side of the first edge ground pad EGP1, and the other one may be overlapped with the boundary between the cover layer 17 and the other side of the first edge ground pad EGP1.

The width in each of the first cutting lines C1a and C1b constituting one pair may be less than 0.5 mm. In this case, it may cause a misalign between the conductive cover member 30 and the first edge ground pad EGP1, and an attachment defect between the conductive cover member 30 and the first edge ground pad EGP1.

The second cutting portion CP2 may be overlapped with the boundary between the cover layer 17 and the first island ground pad IGP1 exposed to the other surface of the base film 11. The second cutting portion CP2 according to one embodiment of the present disclosure may include a pair of second cutting lines C2a and C2b.

One pair of second cutting lines C2a and C2b may be disposed on the boundary between the first island ground pad IGP1 and the cover layer 17, wherein each of the second cutting lines C2a and C2b may have a width of 0.5 mm or more than 0.5 mm being parallel to the first direction X, and a predetermined length being parallel to the second direction Y. In this case, the boundary between the first island ground pad IGP1 and the cover layer 17 may be positioned in the center of the second cutting lines C2a and C2b constituting one pair. One pair of second cutting lines C2a and C2b increases an adhesion area between the conductive cover member 30 and the first island ground pad IGP1 or improves an adhesiveness (or adhesion) between the conductive cover member 30 and the first island ground pad IGP1 in accordance with a step difference (or thickness difference) between the first island ground pad IGP1 and the cover layer 17 so that it is possible to prevent an antistatic function from being deteriorated by a separation or non-adhesion between the conductive cover member 30 and the first island ground pad IGP1. Also, the one pair of second cutting lines C2a and C2b may expose the boundary between the first island ground pad IGP1 and the cover layer 17 to the external, whereby the one pair of second cutting lines C2a and C2b may serve as an align mark configured to align the conductive cover member 30 and the first island ground pad IGP1

For example, any one of the second cutting lines C2a and C2b constituting one pair may be overlapped with the boundary between the cover layer 17 and the first corner portion of the first island ground pad IGP1 being adjacent to the first bending portion P2, and the other one may be overlapped with the boundary between the cover layer 17 and the second corner portion of the first island ground pad IGP1 being adjacent to the first bending portion P2.

The second cutting portion CP2 according to one embodiment of the present disclosure may further include a pair of first cutting holes H1a and H1b.

The one pair of first cutting holes H1a and H1b may be respectively overlapped with the cover layer 17 and the third and fourth corner portions of the first island ground pad IGP1 being adjacent to the corner ground pad CGP. For example, any one of the first cutting holes H1a and H1b constituting one pair may be overlapped with the boundary between the cover layer 17 and the third corner portion of the first island ground pad IGP1, and the other may be overlapped with the boundary between the cover layer 17 and the fourth corner portion of the first island ground pad IGP1. The one pair of first cutting holes H1a and H1b may serve as a discharge hole for discharging bubbles generated for an attachment process of the conductive cover member 30, and also may serve as an align mark configured to align the conductive cover member 30 and the first island ground pad IGP1.

The third cutting portion CP3 may be overlapped with the boundary between the cover layer 17 and the second island ground pad IGP2 exposed to the other surface of the base film 11. The third cutting portion CP3 according to one embodiment of the present disclosure may include a pair of third cutting lines C3a and C3b.

The one pair of third cutting lines C3a and C3b may be disposed on the boundary between the second island ground pad IGP2 and the cover layer 17, wherein each of the third cutting lines C3a and C3b may have a width of 0.5 mm or more than 0.5 mm being parallel to the first direction X, and a predetermined length being parallel to the second direction Y. In this case, the boundary between the second island ground pad IGP2 and the cover layer 17 may be positioned in the center of the third cutting lines C3a and C3b constituting one pair. The one pair of third cutting lines C3a and C3b increases an adhesion area between the conductive cover member 30 and the second island ground pad IGP2 or improves an adhesiveness (or adhesion) between the conductive cover member 30 and the second island ground pad IGP2 in accordance with a step difference (or thickness difference) between the second island ground pad IGP2 and the cover layer 17 so that it is possible to prevent an antistatic function from being deteriorated by a separation or non-adhesion between the conductive cover member 30 and the second island ground pad IGP2. Also, the one pair of third cutting lines C3a and C3b may expose the boundary between the second island ground pad IGP2 and the cover layer 17 to the external, whereby the one pair of third cutting lines C3a and C3b may serve as an align mark configured to align the conductive cover member 30 and the second island ground pad IGP2 for an attachment process of the conductive cover member 30.

For example, any one of the third cutting lines C3a and C3b constituting one pair may be overlapped with the boundary between the cover layer 17 and the first corner portion of the second island ground pad IGP2 being adjacent to the first bending portion P2, and the other C3b may be overlapped with the boundary between the cover layer 17 and the second corner portion of the second island ground pad IGP2 being adjacent to the first bending portion P2.

The third cutting portion CP3 according to one embodiment of the present disclosure may further include a pair of second cutting holes H2a and H2b.

The one pair of second cutting holes H2a and H2b may be respectively overlapped with the cover layer 17 and the third and fourth corner portions of the second island ground pad IGP2 being adjacent to the second bending portion P4. For example, any one of the second cutting holes H2a and H2b constituting one pair may be overlapped with the boundary between the cover layer 17 and the third corner portion of the second island ground pad IGP2, and the other H2b may be overlapped with the boundary between the cover layer 17 and the fourth corner portion of the second island ground pad IGP2. The one pair of second cutting holes H2a and H2b may serve as a discharge hole for discharging bubbles generated for an attachment process of the conductive cover member 30, and also may serve as an align mark configured to align the conductive cover member 30 and the second island ground pad IGP2.

The fourth cutting portion CP4 may be overlapped with the boundary between the cover layer 17 and the third edge ground pad EGP3 exposed to the other surface of the base film 11. The fourth cutting portion CP4 according to one embodiment of the present disclosure may include a pair of fourth cutting lines C4a and C4b.

The one pair of fourth cutting lines C4a and C4b may be disposed on the boundary between the third edge ground pad EGP3 and the cover layer 17, wherein each of the fourth cutting lines C4a and C4b may have a width of 0.5 mm or more than 0.5 mm being parallel to the second direction Y, and a predetermined length being parallel to the first direction X. In this case, the boundary between the third edge ground pad EGP3 and the cover layer 17 may be positioned in the center of the fourth cutting lines C4a and C4b constituting one pair. The one pair of fourth cutting lines C4a and C4b increases an adhesion area between the conductive cover member 30 and the third edge ground pad EGP3 or improves an adhesiveness (or adhesion) between the conductive cover member 30 and the third edge ground pad EGP3 in accordance with a step difference (or thickness difference) between the third edge ground pad EGP3 and the cover layer 17 so that it is possible to prevent an antistatic function from being deteriorated by a separation or non-adhesion between the conductive cover member 30 and the third edge ground pad EGP3. Also, the one pair of fourth cutting lines C4a and C4b may expose the boundary between the third edge ground pad EGP3 and the cover layer 17 to the external, whereby the one pair of fourth cutting lines C4a and C4b may serve as an align mark configured to align the conductive cover member 30 and the third edge ground pad EGP3 for an attachment process of the conductive cover member 30.

For example, the third edge ground pad EGP3 may have a planar structure of a rectangular shape. In this case, any one C4a of the fourth cutting lines C4a and C4b constituting one pair may be overlapped with the boundary between the cover layer 17 and an upper side of the third edge ground pad EGP3 being adjacent to the second bending portion P4, and the other C4b may be overlapped with the boundary between the cover layer 17 and a lower side of the third edge ground pad EGP3 being adjacent to the third bending portion P6.

If the third edge ground pad EGP3 has a planar shape of "⊂", the fourth cutting portion CP4 according to one embodiment of the present disclosure may further include a pair of fifth cutting lines C5a and C5b.

The one pair of fifth cutting lines C5a and C5b may be disposed on the boundary between the cover layer 17 and each of first and second pad patterns EGP3a and EGP3b of the third edge ground pad EGP3, wherein each of the fifth cutting lines C5a and C5b may have a width of 0.5 mm or more than 0.5 mm being parallel to the second direction Y, and a predetermined length being parallel to the first direction X. In this case, the boundary between the cover layer 17 and each of first and second pad patterns EGP3a and EGP3b of the third edge ground pad EGP3 may be positioned in the center of the fifth cutting lines C5a and C5b constituting one pair. The one pair of fifth cutting lines C5a and C5b increases an adhesion area between the conductive cover member 30 and the pad connection pattern EGP3c or improves an adhesiveness (or adhesion) between the conductive cover member 30 and the pad connection pattern EGP3c in accordance with a step difference (or thickness difference) between the cover layer 17 and the pad connection pattern EGP3c of the third edge ground pad EGP3 so that it is possible to prevent an antistatic function from being deteriorated by a separation or non-adhesion between the conductive cover member 30 and the pad connection pattern EGP3c. Also, the one pair of fifth cutting lines C5a and C5b may expose the boundary between the pad connection pattern EGP3c and the cover layer 17 to the external, whereby the one pair of fifth cutting lines C5a and C5b may serve as an align mark configured to align the conductive cover member 30 and the pad connection pattern EGP3c for an attachment process of the conductive cover member 30.

For example, if the third edge ground pad EGP3 has a planar shape of "⊃", any one C5a of the fifth cutting lines C5a and C5b constituting one pair may be overlapped with the boundary between the cover layer 17 and a lower side of the first pad pattern EGP3a of the third edge ground pad EGP3, and the other C5b may be overlapped with the boundary between the cover layer 17 and an upper side of the second pad pattern EGP3b of the third edge ground pad EGP3. In this case, the boundary between the cover layer 17 and the upper side of the first pad pattern EGP3a of the third edge ground pad EGP3 being adjacent to the second bending portion P4 may be overlapped with any one C4a of the fourth cutting lines C4a and C4b constituting one pair. And, the boundary between the cover layer 17 and the lower side of the second pad pattern EGP3b of the third edge ground pad EGP3 being adjacent to the third bending portion P6 may be overlapped with the other C4b of the fourth cutting lines C4a and C4b constituting one pair.

Referring once again to FIGS. 1 to 4, the conductive cover member 30 may further include an align hole pattern AH which is overlapped with the boundary between the cover layer 17 and the second edge ground pad EGP2 disposed on the second body portion P3 being adjacent to the third bending portion P6.

The align hole pattern AH may be overlapped with the boundary between the cover layer 17 and a lower side of the second edge ground pad EGP2. In this case, the boundary between the cover layer 17 and the lower side of the second edge ground pad EGP2 may be positioned in the center of the align hole pattern AH. The align hole pattern AH exposes the boundary between the cover layer 17 and the lower side of the second edge ground pad EGP2 to the external, whereby the align hole pattern AH serves as an alignment mark configured to align the conductive cover member 30 and the second edge ground pad EGP2 for an attachment process of the conductive cover member 30.

The conductive cover member 30 according to one embodiment of the present disclosure may include a first conductive tape 30-1 and a second conductive tape 30-2.

The first conductive tape 30-1 is configured to cover the other surface of the base film 11 being overlapped with the first body portion P3 of the flexible circuit film 10, and may be electrically connected with the ground pad portion GP. For example, the first conductive tape 30-1 covers the other surface of the base film 11 being overlapped with the first body portion P3, and may be attached to each of the first edge ground pad EGP1, the corner ground pad CGP, the first island ground pad IGP1, and the second island ground pad IGP2 exposed to the other surface of the base film 11.

The first conductive tape 30-1 according to one embodiment of the present disclosure may include a first cover body 30a attached to the cover layer 17 disposed on the first body portion P3, and first to fourth pad contact portions 31, 32, 33 and 34 connected with the first cover body 30a and attached to the ground pad portion GP on the first body portion P3.

The first cover body 30a has a shape corresponding to that of the first body portion P3, and the first cover body 30a may be attached to the exposed cover layer 17 on the first body portion P3.

Figure 5:
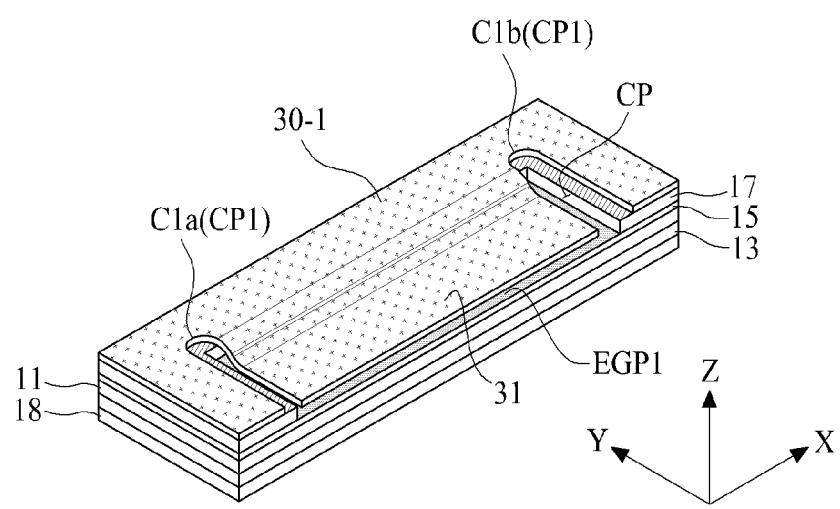
FIG. 5 illustrates an adhesion structure between an edge ground pattern and a first pad contact portion illustrated in FIGS. 1 and 4 according to one embodiment of the present disclosure.

The first pad contact portion 31 includes the first cutting portion CP1, and the first pad contact portion 31 may have an easy attachable structure to the first edge ground pad EGP1 by the first cutting portion CP1. As illustrated in FIG. 5, according as the first pad contact portion 31 is provided in the first edge portion of the first cover body 30a overlapped with the first edge ground pad EGP1 and is attached to the first edge ground pad EGP1, the first pad contact portion 31 has a cantilever shape by the first cutting portion CP1, whereby it enables the smooth collection and discharge of the static electricity introduced to the first edge portion of the first body portion P3.

The first pad contact portion 31 according to one embodiment of the present disclosure may be formed in the cantilever shape at the first edge portion of the first cover body 30a by the one pair of first cutting lines C1a and C1b. With respect to the first direction X, according as the first pad contact portion 31 has the cantilever shape, in which both ends of the first pad contact portion 31 are not overlapped with the step difference portion (or boundary) SP between the first edge ground pad EGP1 and the cover layer 17, the first pad contact portion 31 may be freely attached to the first edge ground pad EGP1 without being influenced by the step difference between the first edge ground pad EGP1 and the cover layer 17. Thus, an adhesion area between the first pad contact portion 31 and the first edge ground pad EGP1 is increased so that it is possible to prevent a separation or non-adhesion between the first pad contact portion 31 and the first edge ground pad EGP1.

The second pad contact portion 32, which corresponds to the first corner portion of the first cover body 30a overlapped with the corner ground pad CGP, is attached to the corner ground pad CGP, whereby it enables the smooth collection and discharge of the static electricity introduced to the first corner portion of the first body portion P3. Selectively, the second pad contact portion 32 may include a pair of cutting lines which are overlapped with the boundary between the corner ground pad CGP and the cover layer 17. In this case, the second pad contact portion 32 is formed in the cantilever shape by the use of one pair of cutting lines, whereby the second pad contact portion 32 may be easily attached to the corner ground pad CGP.

The third pad contact portion 33 includes the second cutting portion CP2, and the third pad contact portion 33 may have an easy attachable structure to the first island ground pad IGP1 by the use of second cutting portion CP2. According as the third pad contact portion 33 is disposed in the second corner portion (or left upper edge portion) of the first cover body 30a overlapped with the first island ground pad IGP1, and is attached to the first island ground pad IGP1, it enables the smooth collection and discharge of the static electricity introduced to the second corner portion of the first body portion P3. In the same manner as the first pad contact portion 31 illustrated in FIG. 5, some of the third pad contact portion 33 may be formed in the cantilever shape by the use of one pair of second cutting lines C2a and C2b, and may be attached to the cover layer 17 while being configured to surround the lateral surface of the first island ground pad IGP1 being adjacent to the first bending portion P2.

The third pad contact portion 33 is aligned with the corner portion of the first island ground pad IGP1 through the use of one pair of first cutting holes H1a and H1b and one pair of second cutting lines C2a and C2b constituting the second cutting portion CP2, whereby the third pad contact portion 33 may be easily attached to the first island ground pad IGP1.

Selectively, each of the second cutting lines C2a and C2b constituting one pair may be connected with each of the first cutting holes H1a and H1b constituting one pair. In the same manner as the first pad contact portion 31 illustrated in FIG. 5, the third pad contact portion 33 has the cantilever shape overlapped with the first island ground pad IGP1, whereby the third pad contact portion 33 may be freely attached to the first island ground pad IGP1 without being influenced by the step difference between the first island ground pad IGP1 and the cover layer 17.

The fourth pad contact portion 34 includes the third cutting portion CP3, and the fourth pad contact portion 34 may have an easy attachable structure to the second island ground pad IGP2 by the use of third cutting portion CP3. Accordingly, as the fourth pad contact portion 34 is disposed in the third corner portion (or right upper edge portion) of the first cover body 30a overlapped with the second island ground pad IGP2, and is attached to the second island ground pad IGP2, it enables the smooth collection and discharge of the static electricity introduced to the third corner portion of the first body portion P3. In the same manner as the first pad contact portion 31 illustrated in FIG. 5, some of the fourth pad contact portion 34 may be formed in the cantilever shape by the use of one pair of third cutting lines C3a and C3b, and may be attached to the cover layer 17 while being configured to surround the lateral surface of the second island ground pad IGP2 being adjacent to the first bending portion P2.

The fourth pad contact portion 34 is aligned with the corner portion of the second island ground pad IGP2 through the use of one pair of second cutting holes H2a and H2b and one pair of third cutting lines C3a and C3b constituting the third cutting portion CP3, whereby the fourth pad contact portion 34 may be easily attached to the second island ground pad IGP2.

Selectively, each of the third cutting lines C3a and C3b constituting one pair may be connected with each of the second cutting holes H2a and H2b constituting one pair. In the same manner as the first pad contact portion 31 illustrated in FIG. 5, the fourth pad contact portion 34 has the cantilever shape overlapped with the second island ground pad IGP2, whereby the fourth pad contact portion 34 may be freely attached to the second island ground pad IGP2 without being influenced by the step difference between the second island ground pad IGP2 and the cover layer 17.

The second conductive tape 30-2 is configured to cover the other surface of the base film 11 being overlapped with the second body portion P5 of the flexible circuit film 10, and may be electrically connected with the ground pad portion GP. For example, the second conductive tape 30-2 covers the other surface of the base film 11 being overlapped with the second body portion P5, and may be attached to each of the second edge ground pad EGP2 and the third edge ground pad EGP3 exposed to the other surface of the base film 11.

The second conductive tape 30-2 according to one embodiment of the present disclosure may include a second cover body 30b attached to the cover layer 17 disposed on the second body portion P5, and fifth and sixth pad contact portions 35 and 36 connected with the second cover body 30b and attached to the ground pad portion GP on the second body portion P5.

The second cover body 30b has a shape corresponding to that of the second body portion P5, and the second cover body 30b may be attached to the exposed cover layer 17 on the second body portion P5.

The fifth pad contact portion 35, which corresponds to one edge portion (or left edge portion) of the second cover body 30b overlapped with the second edge ground pad EGP2, is attached to the second edge ground pad EGP2, whereby it enables the smooth collection and discharge of the static electricity introduced to one edge portion of the second body portion P5. Selectively, the fifth pad contact portion 35 may include a pair of cutting lines which are overlapped with the boundary between the second edge ground pad EGP2 and the cover layer 17. In this case, the fifth pad contact portion 35 is formed of the cantilever shape in one edge portion of the second cover body 30b by the use of one pair of cutting lines, whereby the fifth pad contact portion 35 may be easily attached to the second edge ground pad EGP2.

The sixth pad contact portion 36 includes the fourth cutting portion CP4, and the sixth pad contact portion 36 may have an easy attachable structure to the third edge ground pad EGP3 by the use of fourth cutting portion CP4. In the same manner as the first pad contact portion 31 illustrated in FIG. 5, according as the sixth pad contact portion 36 is provided in the other edge portion (or right edge portion) of the second cover body 30b overlapped with the third edge ground pad EGP3, and is attached to the third edge ground pad EGP3, the sixth pad contact portion 36 has the cantilever shape by the fourth cutting portion CP4, whereby it enables to the smooth collection and discharge of the static electricity introduced to the other edge portion of the second body portion P5.

The sixth pad contact portion 36 according to one embodiment of the present disclosure may be formed in the cantilever shape at the other edge portion of the second cover body 30b by the use of one pair of fourth cutting lines C4a and C4b. With respect to the second direction Y, according as the sixth pad contact portion 36 has the cantilever shape, in which both ends of the sixth pad contact portion 36 are not overlapped with the step difference portion (or boundary) SP between the third edge ground pad EGP3 and the cover layer 17, the sixth pad contact portion 36 may be freely attached to the third edge ground pad EGP3 without being influenced by the step difference between the third edge ground pad EGP3 and the cover layer 17. Thus, an adhesion area between the sixth pad contact portion 36 and the third edge ground pad EGP3 is increased so that it is possible to prevent a separation or non-adhesion between the sixth pad contact portion 36 and the third edge ground pad EGP3.

The sixth pad contact portion 36 according to another embodiment of the present disclosure may include first to third partial contact portions 36a, 36b and 36c which are formed in the cantilever shape at the other edge portion of the second cover body 30b by the use of one pair of fourth cutting lines C4a and C4b and one pair of fifth cutting lines C5a and C5b.

The first partial contact portion 36a is formed in the cantilever shape between any one of the fourth cutting lines C4a and C4b constituting one pair and any one of the fifth cutting lines C5a and C5b constituting one pair, and may be attached to the first pad pattern EGP3a of the third edge ground pad EGP3. The second partial contact portion 36b is formed in the cantilever shape between the other of the fourth cutting lines C4a and C4b constituting one pair and the other of the fifth cutting lines C5a and C5b constituting one pair, and may be attached to the second pad pattern EGP3b of the third edge ground pad EGP3. The third partial contact portion 36c is formed in the cantilever shape between the fifth cutting lines C5a and C5b constituting one pair, and may be attached to the pad connection pattern EGP3c of the third edge ground pad EGP3. Accordingly, as the sixth pad contact portion 36 includes the first to third partial contact portions 36a, 36b and 36c formed in the cantilever shape, the sixth pad contact portion 36 may be freely attached to the first pad pattern EGP3a without being influenced by the step difference between the third edge ground pad EGP3 and the cover layer 17, whereby an adhesion area to the third edge ground pad EGP3 is increased, to thereby prevent a separation from the third edge ground pad EGP3.

The second conductive tape 30-2 according to one embodiment of the present disclosure may further include an align hole pattern AH.

The align hole pattern AH may be overlapped with the boundary between the cover layer 17 and a lower side of the second edge ground pad EGP2. In this case, the boundary between the cover layer 17 and the lower side of the second edge ground pad EGP2 may be positioned in the center of the align hole pattern AH. The align hole pattern AH exposes the boundary between the cover layer 17 and the lower side of the second edge ground pad EGP2 to the external, whereby the align hole pattern AH serves as an alignment mark configured to align the conductive cover member 30 and the second edge ground pad EGP2 for an attachment process of the conductive cover member 30.

The flexible printed circuit board 1 according to one embodiment of the present disclosure includes the conductive cover member 30 attached to the ground pad portion GP exposed to the flexible circuit film 10 so that it is possible to improve the ground efficiency, and furthermore, to prevent the circuit components from being damaged by the static electricity. Also, the flexible printed circuit board 1 according to one embodiment of the present disclosure includes the cutting portion CP formed in the conductive cover member 30 which is overlapped with the ground pad portion GP exposed to the flexible circuit film 10, whereby it enables the easy attachment between the conductive cover member 30 and the ground pad portion GP. Thus, the adhesion area between the conductive cover member 30 and the ground pad portion GP is increased so that it is possible to improve the ground function.

Figure 4:
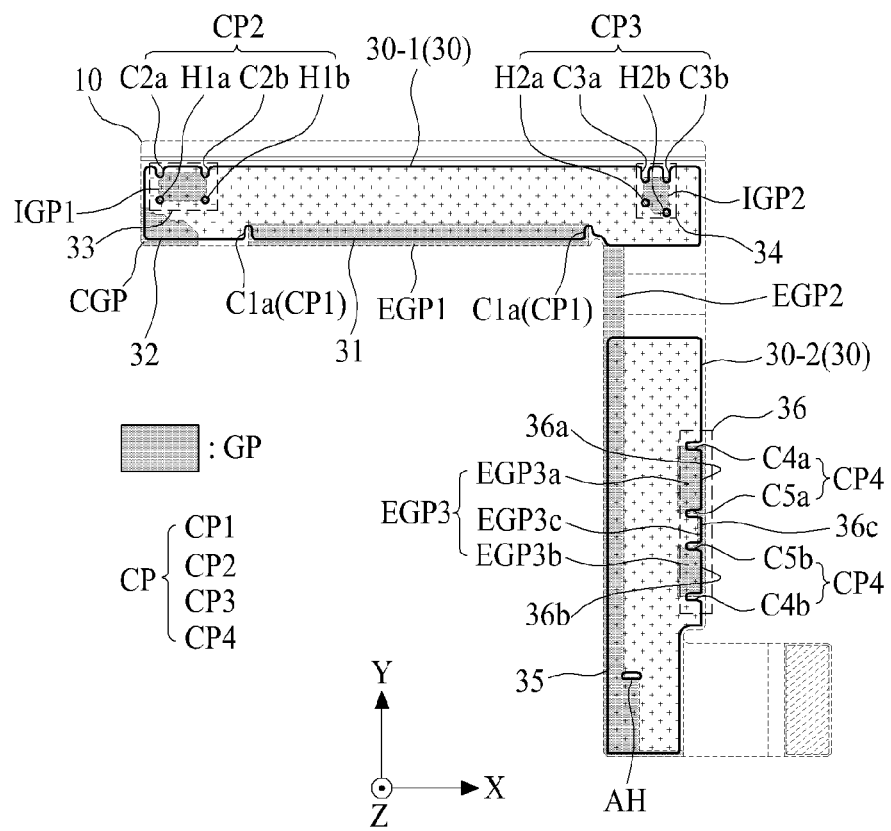
FIG. 4 illustrates a conductive cover member illustrated in FIG. 1 according to one embodiment of the present disclosure.
Figure 6:
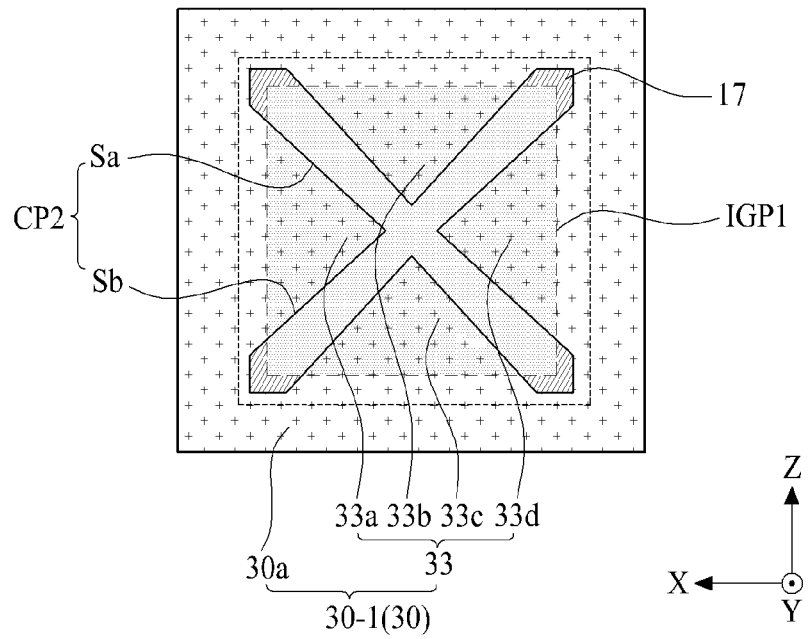
FIG. 6 illustrates another embodiment of a third pad contact portion illustrated in FIG. 4.

FIG. 6 illustrates another example of the third pad contact portion illustrated in FIG. 4, which is obtained by changing a structure of a first island ground pad and a structure of a third pad contact portion.

Referring to FIG. 6 in connection with FIG. 4, the third pad contact portion 33 according to another embodiment of the present disclosure includes a second cutting portion CP2, and may have an easy attachable structure to a first island ground pad IGP1 by the use of second cutting portion CP2.

The second cutting portion CP2 may include first and second slits Sa and Sb which are overlapped with a first island ground pad IGP1 having a rectangular shape and are configured to cross each other.

The first and second slits Sa and Sb may cross each other on the center of the first island ground pad IGP1. For example, the first and second slits Sa and Sb may have a planar structure of "x" shape or "+" shape. The first and second slits Sa and Sb may expose the boundary between the first island ground pad IGP1 and a cover layer 17 to the external. For example, the boundary between the corner portion of the first island ground pad IGP1 and the cover layer 17 may be exposed to the external through the first and second slits Sa and Sb.

The third pad contact portion 33 may include first to fourth pad attachment portions 33a, 33b, 33c and 33d which are spaced apart from each other and are overlapped with the first island ground pad IGP1.

The first to fourth pad attachment portions 33a, 33b, 33c and 33d, which protrude in a cantilever shape from a first cover body 30a by the first and second slits Sa and Sb, may be attached to the first island ground pad IGP1.

The third pad contact portion 33 according to another embodiment of the present disclosure includes the first to fourth pad attachment portions 33a, 33b, 33c and 33d which have the cantilever shape by the first and second slits Sa and Sb overlapped with the first island ground pad IGP1, whereby the third pad contact portion 33 may be easily attached to the first island ground pad IGP1. Accordingly, an adhesion area between the third pad contact portion 33 and the first island ground pad IGP1 is increased so that it is possible to prevent a separation or non-adhesion between the third pad contact portion 33 and the first island ground pad IGP1.

Selectively, the third pad contact portion 33 according to another embodiment of the present disclosure may be identically applied to the fourth pad contact portion 34 of the conductive cover member 30 illustrated in FIG. 4.

Figure 7:
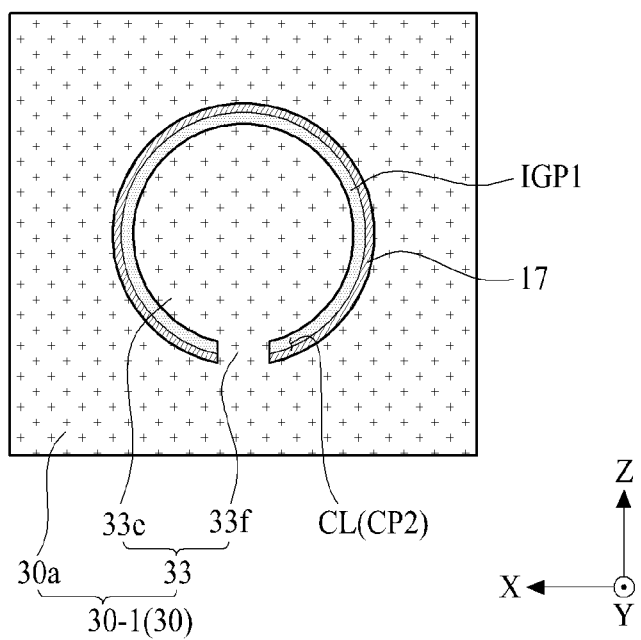
FIG. 7 illustrates another embodiment of a third pad contact portion illustrated in FIG. 4.

FIG. 7 illustrates another example of the third pad contact portion illustrated in FIG. 4, which is obtained by changing a structure of a first island ground pad and a structure of a third pad contact portion.

Referring to FIG. 7 in connection with FIG. 4, the first island ground pad IGP1 according to another embodiment of the present disclosure may be exposed while being configured to have a planar structure of a circular shape.

The third pad contact portion 33 according to another embodiment of the present disclosure includes a second cutting portion CP2, and may have an easy attachable structure to the first island ground pad IGP1 by the use of second cutting portion CP2.

The second cutting portion CP2 is provided in a first conductive tape 30-1 and is formed in "C" shape while being overlapped with the boundary between a cover layer 17 and the circular-shaped first island ground pad IGP1, whereby the second cutting portion CP2 exposes the boundary between the cover layer 17 and the circular-shaped first island ground pad IGP1 to the external.

The third pad contact portion 33 may include a pad attachment portion 33e overlapped with the circular-shaped first island ground pad IGP1, and a neck portion 33f disposed between the pad attachment portion 33e and the first cover body 30a.

The pad attachment portion 33e may have a relatively smaller size in comparison to the circular-shaped first island ground pad IGP1. The pad attachment portion 33e is configured to have the circular shape by the second cutting portion CP2, and may be overlapped with the first island ground pad IGP1.

The neck portion 33f is connected between the pad attachment portion 33e and the first cover body 30a, to thereby support the pad attachment portion 33e. The neck portion 33f may be overlapped with the boundary between the first island ground pad IGP1 and the cover layer 17.

Accordingly, the third pad contact portion 33 according to another embodiment of the present disclosure is formed in the cantilever shape by the neck portion 33f and the pad attachment portion 33e, and may be attached to the first island ground pad IGP1. The third pad contact portion 33 has the cantilever shape, in which the pad attachment portion 33e is not overlapped with the step difference portion (or boundary portion) between the first island ground pad IGP1 and the cover layer 17, whereby the pad attachment portion 33e of the third pad contact portion 33 may be freely attached to the first island ground pad IGP1 without being influenced by the step difference between the first island ground pad IGP1 and the cover layer 17. Accordingly, an adhesion area between the third pad contact portion 33 and the first island ground pad IGP1 is increased so that it is possible to prevent a separation or non-adhesion between the third pad contact portion 33 and the first island ground pad IGP1.

Selectively, the third pad contact portion 33 according to another embodiment of the present disclosure may be identically applied to the fourth pad contact portion 34 of the conductive cover member 30 illustrated in FIG. 4.

Figure 8:
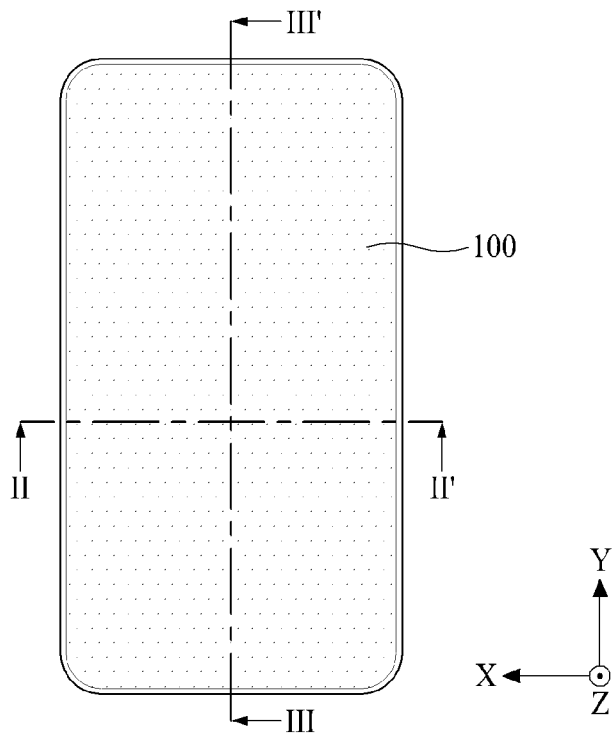
FIG. 8 is a plane view illustrating an electronic device according to one embodiment of the present disclosure.
Figure 9:
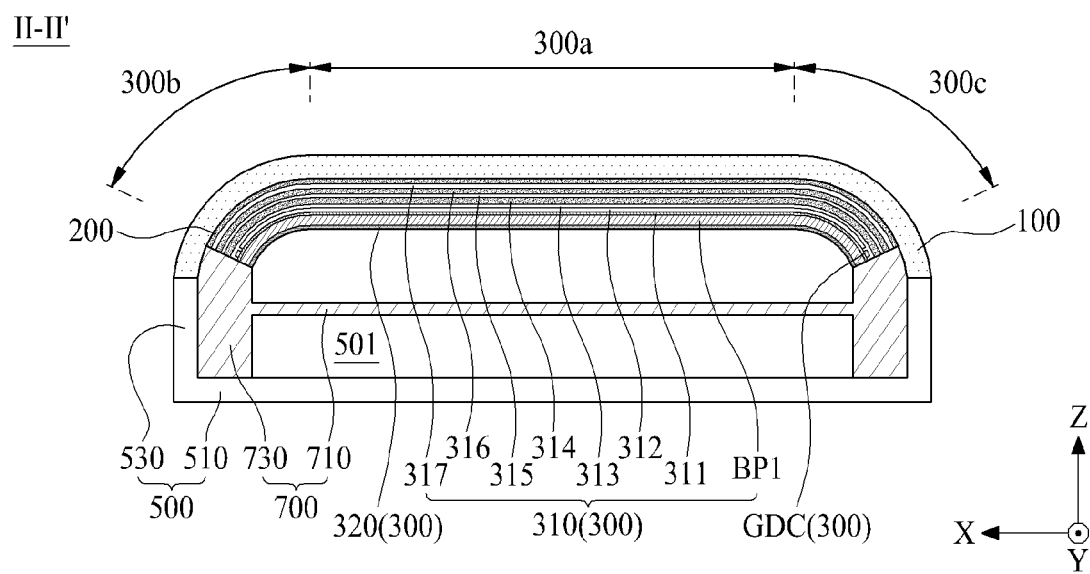
FIG. 9 is a cross-sectional view taken along line II-IT of FIG. 8 according to one embodiment of the present disclosure.
Figure 10:
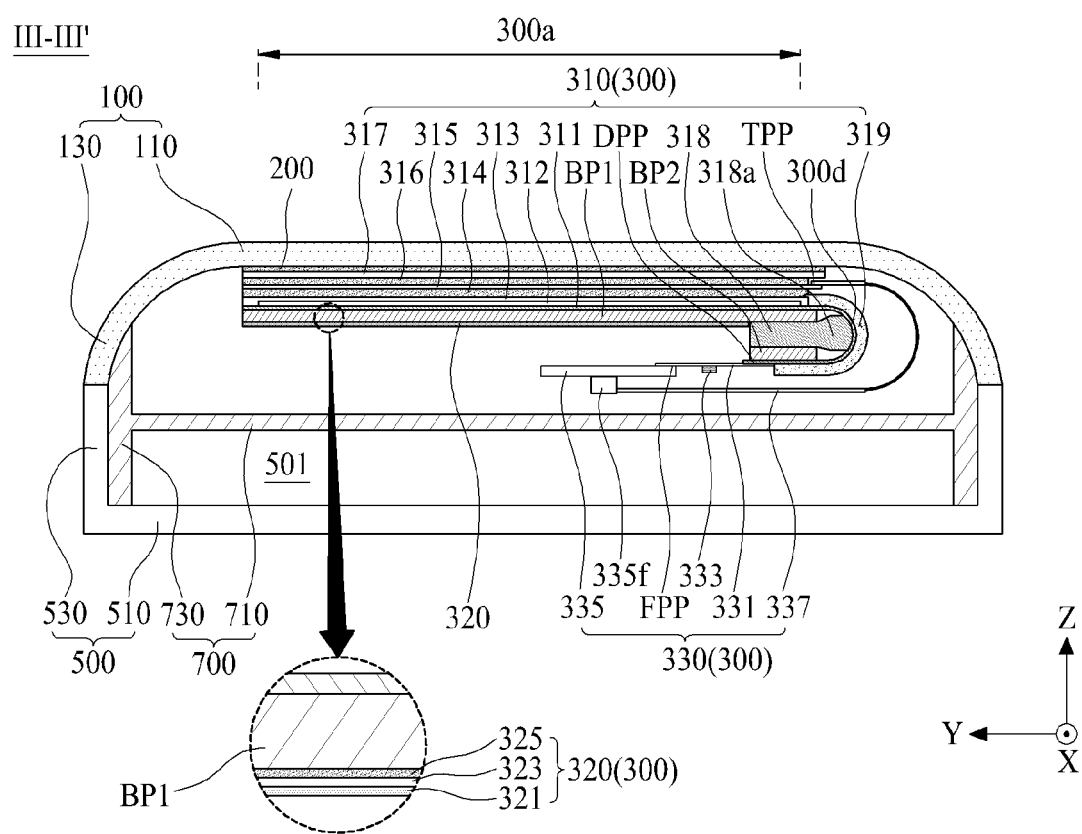
FIG. 10 is a cross-sectional view taken along line III-III' of FIG. 8 according to one embodiment of the present disclosure.

FIG. 8 is a plane view illustrating an electronic device according to one embodiment of the present disclosure. FIG. 9 is a cross-sectional view taken along line II-IT of FIG. 8. FIG. 10 is a cross-sectional view taken along line III-III' of FIG. 8. Herein, a scale of the electronic device illustrated in FIGS. 8 to 10 may be different from a 1:1 scale, for convenience of explanation, whereby it is not limited to the scale illustrated in the drawings.

Referring to FIGS. 8 to 10, the electronic device according to one embodiment of the present disclosure may include a cover window 100, a flexible display module 300, and a housing 500.

The cover window 100 covers front and lateral surfaces of the flexible display module 300, whereby the cover window 100 protects the flexible display module 300 from an external shock.

The cover window 100 according to one embodiment of the present disclosure may be formed of a transparent plastic material, a glass material, or a tempered glass material. For example, the cover window 100 may be formed of sapphire glass or gorilla glass, or may be formed in a deposition structure of sapphire glass and gorilla glass. According to another example, the cover window 100 may include a transparent plastic material. In consideration of scratch and transparency, the cover window 100 may be formed of tempered glass.

The cover window 100 according to one embodiment of the present disclosure may include a front portion 110 and a sidewall portion 130.

The front portion 110 corresponds to a central portion of the cover window 100, wherein the front portion 110 may be a transparent portion through which light may pass. The front portion 110 may have a flat shape. The front portion 110 may be a front window.

The sidewall portion 130 may be bent in a curved-line shape with a predetermined radius of curvature from the edge of the front portion 110. Accordingly, the edge of the front portion 110 may have a wholly-curved structure by the sidewall portion 130. The sidewall portion 130 may be a lateral window or lateral curved-line window.

Accordingly, as the cover window 100 has a wholly-curved 4-side bending structure, it is possible to realize a good design in the electronic device, and to reduce a bezel width in each of horizontal and vertical directions of the electronic device.

Additionally, the cover window 100 may further include a design layer (or decoration layer) prepared in the edge. The design layer is printed at least one time on the edge of a rear surface (or back surface) of the cover window 100 confronting the flexible display module 300 so that it is possible to cover a non-display area on which an image is not displayed in the electronic device.

Selectively, the cover window 100 according to one embodiment of the present disclosure may be formed in a plate shape comprising only the front portion 110. In this case, the aforementioned sidewall portion 130 is omitted.

The flexible display module 300 may be a flexible display module of a flat display device. For the following description of the present disclosure, it is assumed that the flexible display module 300 is a flexible light emitting display module.

The flexible display module 300 is connected with the rear surface (or back surface) of the cover window 100 so that it is possible to display an image or to sense a user's touch. The flexible display module 300 may be bonded to a rear surface of the front portion 110 of the cover window 100 by a direct bonding process using a module bonding member 200. Herein, the module bonding member 200 may include pressure sensitive adhesive (PSA), optically clear adhesive (OCA), or optically clear resin (OCR). The module bonding member 200 may be expressed as a transparent adhesive member.

The flexible display module 300 according to one embodiment of the present disclosure may include a display portion 300a, a first bending display portion 300b, and a second bending display portion 300c.

The display portion 300a may be configured to display an image on the front portion 110 of the cover window 100. The first bending display portion 300b, which is bent in shape of curved surface from the first edge of the display portion 300a, and may be configured to display an image on the curved surface of the first sidewall in the sidewall portion 130 of the cover window 100. The second bending display portion 300c, which is bent in a shape of a curved surface from the second edge of the display portion 300a, may be configured to display an image on the curved surface of the second sidewall in the sidewall portion 130 of the cover window 100. Selectively, it is possible to omit the first bending display portion 300b and the second bending display portion 300c. In this case, the display portion 300a of the flexible display module 300 may be overlapped with the front portion 110 of the cover window 100, however, may be not overlapped with the sidewall portion 130.

The flexible display module 300 according to one embodiment of the present disclosure may include a flexible display panel 310 including the display portion 300a, a panel bending portion 300d and a display pad portion DPP, and a display driving circuit portion 330 comprising a driving integrated circuit 333 disposed in a rear surface of the flexible display panel 310 and connected with the display pad portion DPP.

The flexible display panel 310 may display an image on each of the display portion 300a, the first bending display portion 300b, and the second bending display portion 300c, or may display an image only on the display portion 300a. The flexible display panel 310 according to one embodiment of the present disclosure may include a flexible substrate 311, a pixel array 312, a gate driving circuit GDC, the display pad portion DPP, an encapsulation portion 313, a touch electrode portion 315, a touch pad portion TPP, a functional film 317, a first back plate BP1, a second back plate BP2, and a bending maintenance member 318.

The flexible substrate 311 may be defined as a base substrate of the flexible display panel 310. The flexible substrate 311 according to one embodiment of the present disclosure may include a plastic material with flexibility, for example, opaque or colored polyimide (PI). The flexible substrate 311 according to another embodiment of the present disclosure may be formed in a thin film of a glass material having flexibility.

The pixel array 312 according to one embodiment of the present disclosure is formed on the display portion 300a, the first bending display portion 300b, and the second bending display portion 300c defined in the flexible substrate 311, whereby an image may be displayed on each of the display portion 300a, the first bending display portion 300b, and the second bending display portion 300c.

The pixel array 312 may include a plurality of pixels which are prepared in a pixel area defined by signal lines on the flexible substrate 311, and are configured to display an image in accordance with a signal supplied to the signal lines. The signal lines may include a gate line, a data line, and a pixel driving power source line.

Each of the plurality of pixels may include a pixel circuit layer comprising a driving thin film transistor prepared in the pixel area, an anode electrode electrically connected with the driving thin film transistor, an emission device layer formed on the anode electrode, and a cathode electrode electrically connected with the emission device layer.

The driving thin film transistor is prepared in a transistor area of each pixel area defined on the flexible substrate 311, and the driving thin film transistor may include a gate electrode, a gate insulating film, a semiconductor layer, a source electrode, and a drain electrode. Herein, the semiconductor layer of the thin film transistor may include silicon of a-Si, poly-Si, or low-temperature poly-si, or may include an oxide such as Indium-Gallium-Zinc-Oxide (IGZO).

The anode electrode is prepared as a pattern shape in an opening area defined in each pixel area, and is electrically connected with the driving thin film transistor.

The emission device layer according to one embodiment of the present disclosure may include an organic light emitting device formed on the anode electrode. The organic light emitting device may be configured to emit the same colored light by each pixel, for example, white colored light by each pixel, or may be configured to emit the different colored light by each pixel, for example, red colored light, green colored light, or blue colored light by each pixel.

The emission device layer according to one embodiment of the present disclosure may include a micro light emitting diode device electrically connected with the anode electrode and the cathode electrode. The micro light emitting diode device may be a light emitting diode realized in an integrated circuit (IC) or chip, wherein the micro light emitting diode device may include a first terminal electrically connected with the anode electrode, and a second terminal electrically connected with the cathode electrode.

The cathode electrode may be connected with an emission device of the emission device layer prepared for each pixel area in common.

The gate driving circuit GDC may be formed in the first edge and/or second edge of the flexible substrate 311 so that the gate driving circuit GDC may be connected with one end and/or the other end in each gate signal line prepared on the flexible substrate 311. The gate driving circuit GDC may generate a gate signal in response to a gate control signal supplied through the display pad portion DPP, and may supply the generated gate signal to each of the plurality of gate lines. The gate driving circuit GDC may be a gate embedded circuit formed for a process of manufacturing the thin film transistor of the pixel, but the present disclosure is not limited thereto.

The display pad portion DPP may include a plurality of pad electrodes prepared at one edge (or non-display area of one side) of the flexible substrate 311 which is apart from one side of the pixel array 312. Each of the plurality of pad electrodes may be electrically connected with the gate driving circuit and the signal line of the pixel array 312 through a link line disposed in the panel bending area 300d between the display pad portion DPP and one side of the pixel array 312.

The encapsulation portion 313 is formed on the flexible substrate 311 while being configured to surround the pixel array 312 so that it is possible to prevent oxygen or moisture from being permeated into the emission device layer of the pixel array 312. The encapsulation portion 313 according to one embodiment of the present disclosure may be formed in a multi-layered structure obtained by alternately depositing an organic material layer and an inorganic material layer. Herein, the inorganic material layer prevents oxygen or moisture from being permeated into the emission device layer of the pixel array 312. And, the organic material layer may be formed in a relatively large thickness in comparison to the inorganic material layer so that the organic material layer may cover particles which might be generated for a manufacturing process. For example, the encapsulation portion 313 may include a first inorganic film, an organic film on the first inorganic film, and a second inorganic film on the organic film. In this case, the organic film may be defined as a particle cover layer.

The touch electrode portion 315 is disposed on the encapsulation portion 313, wherein the touch electrode portion 315 serves as a touch sensor capable of sensing a user's touch on the cover window 100.

The touch electrode portion 315 according to one embodiment of the present disclosure may include a touch electrode layer disposed on the encapsulation portion 313 overlapped with the pixel array 312, and a dielectric layer configured to cover the touch electrode layer. Selectively, the touch electrode portion 315 may be provided on a touch buffer layer configured to cover the encapsulation portion 313. For example, the touch electrode layer may include a plurality of touch driving electrodes disposed at fixed intervals on the encapsulation portion 313 overlapped with the pixel array 312, and a plurality of touch sensing electrodes electrically insulated from the touch driving electrodes. The touch sensing electrodes may be disposed in the same layer as the touch driving electrodes, or may be disposed in the different layer from the touch driving electrodes with the dielectric layer interposed in-between.

The touch electrode portion 315 according to another embodiment of the present disclosure may be substituted by a capacitive touch panel generally known to those in the art. In this case, the touch panel may be attached onto the encapsulation portion 313 by the use of transparent adhesive member 314. Herein, the transparent adhesive member 314 may include pressure sensitive adhesive (PSA), optically clear adhesive (OCA), or optically clear resin (OCR).

The touch pad portion TPP according to one embodiment of the present disclosure may include a plurality of touch pad electrodes which are disposed on the edge portion of the touch electrode portion 315 provided on one surface (or upper surface) of the flexible substrate 311 and are electrically connected with the touch electrode portion 315. The plurality of touch pad electrodes may be connected with the touch sensing electrodes and touch driving electrodes through a plurality of touch routing lines in one-to-one correspondence. The touch pad portion TPP may be overlapped with the link line disposed on the flexible substrate 311.

The touch pad portion TPP according to another embodiment of the present disclosure may be disposed on the edge portion of the touch electrode portion 315 provided on the other surface of the flexible substrate 311, and may be connected with the touch sensing electrodes and touch driving electrodes through the plurality of touch routing lines in one-to-one correspondence.

If the touch electrode portion 315 is substituted by the touch panel, the touch pad portion TPP may be disposed on the edge portion of the touch panel, and may be connected with the touch sensing electrodes and touch driving electrodes through the plurality of touch routing lines in one-to-one correspondence.

The functional film 317 is attached onto the touch electrode portion 315 by the use of film adhesive member 316, and may be attached to the rear surface (or back surface) of the cover window 100 by the use of module bonding member 200. Herein, the film adhesive member 316 may include pressure sensitive adhesive (PSA), optically clear adhesive (OCA), or optically clear resin (OCR).

The functional film 317 according to one embodiment of the present disclosure may include a reflection preventing layer (or reflection preventing film) configured to prevent a reflection of ambient light so as to improve contrast ratio and outdoor visibility for an image displayed on the flexible display panel 310. For example, the reflection preventing layer may include a circular polarizing layer (or circular polarizing film) configured to prevent ambient light being incident through the cover window 100 from being reflected on the thin film transistor and/or lines disposed in the pixel array 312 and being advanced toward the cover window 100.

The functional film 317 may further include a barrier layer (or barrier film) configured to firstly prevent a permeation of moisture or oxygen, wherein the barrier layer may be formed of a material with low moisture permeation, for example, polymer.

Also, the functional film 317 may further include a light path control layer (or light path control film) configured to control a path of light emitted from the pixel array 312 to the cover window 100. The light path control layer may have a deposition structure obtained by alternately depositing a high refraction layer and a low refraction layer, whereby a path of light being provided from the pixel array 312 may be changed, to thereby minimize a color shift in accordance with a viewing angle.

Selectively, the functional film 317 may be disposed between the touch electrode portion 315 and the encapsulation portion 313. In this case, the touch electrode portion 315 may be attached to the cover window 100 by the use of module bonding member 200.

The first back plate BP1 is attached to the rear surface (or back surface) of the flexible substrate 311 being overlapped with the pixel array 312, whereby the rear surface (or back surface) of the flexible substrate 311 being overlapped with the pixel array 312 is maintained in a plane state.

The second back plate BP2 is attached to one edge of the rear surface (or back surface) of the flexible substrate 311 being overlapped with the display pad portion DPP, whereby the one edge of the rear surface (or back surface) of the flexible substrate 311 is maintained in a plane state.

A link line area of the flexible substrate 311, which is provided with link lines while being overlapped with an area between the first back plate BP1 and the second back plate BP2, may be defined as the panel bending area 300d which is bent with a predetermined radius of curvature. That is, the panel bending area 300d of the flexible substrate 311 is not supported in a plane state by the first back plate BP1 and the second back plate BP2, whereby the panel bending area 300d of the flexible substrate 311 may be freely bent. Accordingly, the panel bending area 300d of the flexible substrate 311 is bent to surround one lateral surface of the first back plate BP1 confronting the second back plate BP2, whereby the display pad portion DPP may be overlapped with one rear edge of the first back plate BP1. Therefore, the panel bending area 300d of the flexible substrate 311 is bent to have a predetermined radius of curvature, and thus, the flexible display module 300 may have a small bezel width.

The bending maintenance member 318 may be disposed between the first back plate BP1 and the second back plate BP2 being overlapped with each other with respect to a thickness direction Z of the flexible display panel 310. The bending maintenance member 318 fixes the second back plate BP2 disposed on the rear surface of the first back plate BP1 to one rear edge of the first back plate BP1 in accordance with the bending of the flexible substrate 311 so that it is possible to maintain the bending state and bending shape of the flexible substrate 311.

One surface (or front surface) of the bending maintenance member 318 may be attached to one edge portion of the rear surface (or back surface) of the first back plate BP1. The other surface (or rear surface) of the bending maintenance member 318 may be attached to the second back plate BP2.

The bending maintenance member 318 according to one embodiment of the present disclosure may include a bar-shaped metal material structure, a plastic-material structure, or a double-sided tape. Selectively, the bending maintenance member 318 according to one embodiment of the present disclosure may include a bending guide portion 318a which is protruding toward the panel bending area 300d of the flexible substrate 311. An outer lateral surface of the bending guide portion 318a may have a curved-line shape which enables to bend the panel bending area 300d of the flexible substrate 311 in a curved-line shape.

The flexible display panel 310 according to one embodiment of the present disclosure may further include a micro cover layer 319 configured to cover the panel bending area 300d of the flexible substrate 311.

The micro cover layer 319 may cover the panel bending area 300d of the flexible substrate 311 disposed between the encapsulation portion 313 and the display pad portion DPP.

The micro cover layer 319 may include a polymer material, wherein the micro cover layer 319 may be coated on to the panel bending area 300d of the flexible substrate 311 to cover the link line between the encapsulation portion 313 and the display pad portion DPP. The micro cover layer 319 protects the link line from an external shock, and also prevents a moisture permeation into the link line. Especially, when the panel bending area 300d of the flexible substrate 311 is bent in a curved-line shape with a predetermined radius of curvature, the micro cover layer 319 is provided to position the link line on a neutral plane. That is, when the panel bending area 300d of the flexible substrate 311 is bent with a predetermined radius of curvature, the neutral plane, in which each of a tensile force and a compressive force becomes '0' (zero), exists between the flexible substrate 311 and the micro cover layer 319. Accordingly, the micro cover layer 319 may include a material whose elastic coefficient is relatively higher than that of the flexible substrate 311 so that the link lines may be positioned in the neutral plane. Thus, the link lines are positioned in the neutral plane between the micro cover layer 319 and the flexible substrate 311. That is, when the panel bending area 300d of the flexible substrate 311 is bent in a curved-line shape, a bending stress of '0' is applied to the link lines positioned in the neutral plane between the micro cover layer 319 and the flexible substrate 311, whereby the link lines may be bent without any damage caused by the bending stress.

The flexible display module 300 according to one embodiment of the present disclosure may further include a conductive heat dissipating portion 320 connected with the rear surface (or back surface) of the flexible display panel 310.

The conductive heat dissipating portion 320 may be attached to the rear surface (or back surface) of the first back plate BP1. The conductive heat dissipating portion 320 protects the flexible display panel 310 from a shock, and radiates heat of the flexible display panel 310. The conductive heat dissipating portion 320 may be a heat dissipating tape, a heat dissipating cushion tape, a conductive heat dissipating tape, a heat dissipating sheet, a heat dissipating ground sheet, or a conductive heat dissipating sheet.

The conductive heat dissipating portion 320 according to one embodiment of the present disclosure may be attached to the entire rear surface of the first back plate BP1. In this case, according as one surface (or front surface) of the bending maintenance member 318 is attached to the conductive heat dissipating portion 320, a distance between the first back plate BP1 and the second back plate BP2 is increased so that it is possible to reduce a bending repulse force by the panel bending portion 300d of the flexible substrate 311 being bent in a curved-line shape.

The conductive heat dissipating portion 320 according to one embodiment of the present disclosure may be attached to the remaining portions of the rear surface of the first back plate BP1 except an arrangement area for the bending maintenance member 318. In this case, one surface (or front surface) of the bending maintenance member 318 is directly attached to the first back plate BP1 from which some portions of the conductive heat dissipating portion 320 are removed, whereby a thickness of the flexible display panel 310 may be reduced.

The conductive heat dissipating portion 320 according to one embodiment of the present disclosure may include a heat dissipating member 321, a cushion member 323, and an adhesion member 325.

The heat dissipating member 321 may include a heat dissipating layer having a metal material with a relatively high thermal conductivity. The heat dissipating member 321 according to one embodiment of the present disclosure may include a metal layer of copper (Cu). The heat dissipating member 321 according to another embodiment of the present disclosure may include a metal layer of copper (Cu), and a graphite layer coated onto the metal layer. The heat dissipating member 321 may provide a heat dissipating function, a ground function, and a protection function for protecting the rear surface of the flexible display panel 310.

The cushion member 323 may include a foam tape or foam pad connected with a front surface of the heat dissipating member 321. The cushion member 323 may absorb a shock.

The adhesion member 325 may be connected with a front surface of the cushion member 323. The adhesion member 325 may include an uneven surface structure (or embossing structure) formed in its surface. The uneven surface structure of the adhesion member 325 prevents bubbles from being generated between the first back plate BP1 and the conductive heat dissipating member 320 for an attachment process between the first back plate BP1 and the conductive heat dissipating portion 320 so that it is possible to omit a deformation process for removing bubbles generated between the first back plate BP1 and the conductive heat dissipating portion 320.

The display driving circuit portion 330 may be connected with the display pad portion DPP of the flexible display panel 310, whereby the display driving circuit portion 330 may be disposed on the rear surface of the flexible display panel 310. The display driving circuit portion 330 may display an image on the pixel array 312 of the flexible display panel 310, and may sense a user's touch through the touch electrode portion 315 of the flexible display panel 310.

The display driving circuit portion 330 according to one embodiment of the present disclosure may include a panel flexible circuit film 331, a driving integrated circuit 333, a flexible circuit board 335, and a touch flexible circuit film 337.

The panel flexible circuit film 331 may be electrically connected with the display pad portion DPP prepared in the flexible substrate 311 while being disposed in the rear surface of the flexible display panel 310. The panel flexible circuit film 331 according to one embodiment of the present disclosure may be attached to the display pad portion DPP prepared in the flexible substrate 311 through the use of film attachment process using an anisotropic conductive film. For example, the panel flexible circuit film 331 may be a chip on film.

The driving integrated circuit 333 may be mounted on the panel flexible circuit film 331 disposed in the rear surface of the flexible display panel 310. The driving integrated circuit 333 according to one embodiment of the present disclosure may be mounted on the panel flexible circuit film 331 by a chip bonding process or surface mounting process. For example, the driving integrated circuit 333 may be mounted on the panel flexible circuit film 331 disposed between the display pad portion DPP and the flexible circuit board 335. In this case, the driving integrated circuit 333 may be disposed between the rear surface of the flexible display panel 310 and a housing.

The driving integrated circuit 333 according to one embodiment of the present disclosure may generate a data signal and a gate control signal on the basis of timing synchronized signal and video data supplied from an external host driving system (or host driving circuit), may supply the data signal to the data line of each pixel through the display pad portion DPP, and may supply the gate control signal to the gate driving circuit. The driving integrated circuit 333 may be disposed in the rear surface of the flexible display panel 310.

Selectively, the driving integrated circuit 333 is not mounted on the panel flexible circuit film 331, and is mounted (or bounded onto) on a chip mounting area defined in the flexible substrate 311, whereby the driving integrated circuit 333 may be electrically connected with the display pad portion DPP, and may be connected with the signal line in each of the pixel array 312 and the gate driving circuit disposed on the flexible substrate 311. In this case, the panel flexible circuit film 331 may relay a signal transport between the display pad portion DPP and the host driving system, or may be omitted.

The flexible circuit board 335 may be electrically connected with the panel flexible circuit film 331 in the rear surface of the flexible display panel 310. The flexible circuit board 335 according to one embodiment of the present disclosure may be electrically connected with a film pad portion FPP prepared in the panel flexible circuit film 331 by a film attachment process using an anisotropic conductive film, and may be overlapped with the first back plate BP1 of the flexible display panel 310. The flexible circuit board 335 may provide the timing synchronized signal and video data, supplied from the host driving system, to the driving integrated circuit 333 through the display pad portion DPP, and may provide voltages which are necessary for driving the pixel array 312, the gate driving circuit, and the driving integrated circuit 333. The flexible circuit board 335 may be a main flexible printed circuit board or a display driving circuit board.

The flexible circuit board 335 according to one embodiment of the present disclosure includes the same structure as that of the flexible printed circuit board 1 illustrated in FIGS. 1 to 7, whereby a detailed repetitive description for the flexible circuit board 335 will be omitted. In this case, in the flexible printed circuit board 1 illustrated in FIGS. 1 to 7, the bonding pad portion P1 may be electrically connected with the film pad portion FPP prepared in the panel flexible circuit film 331 by a film attachment process using an anisotropic conductive film, and the connector portion P7 may be electrically connected with the host driving system.

The touch flexible circuit film 337 is electrically connected with the touch pad portion TPP prepared in the flexible display panel 310 by a film attachment process using an anisotropic conductive film, and may be electrically connected with a touch connector 335f mounted on the flexible circuit board 335. The touch flexible circuit film 337 supplies a touch driving signal, which is supplied from the flexible circuit board 335, to touch electrodes through the touch pad portion, and may supply a signal corresponding to a capacitance change of the touch electrodes to the flexible circuit board 335 through the touch pad portion TPP.

The touch flexible circuit film 337 according to one embodiment of the present disclosure includes the same structure as that of the flexible printed circuit board 1 illustrated in FIGS. 1 to 7, whereby a detailed repetitive description for the touch flexible circuit film 337 will be omitted. In this case, in the flexible printed circuit board 1 illustrated in FIGS. 1 to 7, the bonding pad portion P1 may be electrically connected with the touch pad portion TPP prepared in the flexible display panel 310 by a film attachment process using an anisotropic conductive film, and the connector portion P7 may be electrically connected with the touch connector 335f mounted on the flexible circuit board 335.

The housing 500 may receive the flexible display panel 300, and may support the cover window 100. For example, the housing 500 may be connected with the sidewall portion 130 of the cover window 100, to thereby support the cover window 100.

The housing 500 according to one embodiment of the present disclosure may include a rear housing 510 configured to cover the rear surface of the flexible display module 300 under the condition that a circuit receiving space 501 is interposed in-between, and a lateral housing 530 configured to support the cover window 100.

The rear housing 510 is disposed in the outermost rear surface of the electronic device, wherein the rear housing 510 may include a plastic material, a metal material, or a glass material. For example, the rear housing 510 may include a glass material with a color coating layer.

The lateral housing 530 according to one embodiment of the present disclosure is disposed in the outermost lateral surface of the electronic device, wherein the lateral housing 530 may be bent from the edge of the rear housing 510 and be connected with the sidewall portion 130 of the cover window 100.

The lateral housing 530 according to another embodiment of the present disclosure may be formed of a plastic material, a metal material, or a glass material, and may be disposed in the edge of the sidewall portion 130 of the cover window 100.

The circuit receiving space 501 is prepared between the rear surface of the flexible display module 300 and the rear housing 510, wherein the host driving system, memory and battery may be received in the circuit receiving space 501.

The electronic device according to one embodiment of the present disclosure may further include a middle frame 700.

The middle frame 700 is disposed in the circuit receiving space 501 of the housing 500, and the middle frame 700 may support circuit components disposed in the circuit receiving space 501. The middle frame 700 may support the cover window 100. The middle frame 700 according to one embodiment of the present disclosure may include a middle plate 710 and a middle sidewall 730.

The middle plate 710, which is disposed between the rear surface of the flexible display module 300 and the rear housing 510, may support the circuit components disposed in the circuit receiving space 501.

The middle sidewall 730, which is vertically connected with a lateral surface of the middle plate 710, may support the sidewall portion 130 of the cover window 100.

Selectively, the lateral housing 530 of the housing 500 may be substituted by the middle sidewall 730 of the middle frame 700. In this case, the middle sidewall 730 of the middle frame 700 may be disposed between the sidewall portion 130 of the cover window 100 and the edge of the rear housing 510, whereby it is possible to omit the lateral housing 530 of the housing 500.

Thus, the electronic device according to one embodiment of the present disclosure includes the flexible circuit board 335 and/or touch flexible circuit film 337 applied with the flexible printed circuit board according to the present disclosure so that it is possible to improve the ground efficiency for the static electricity, and to prevent the circuit components from being damaged by the static electricity.

The flexible printed circuit board according to the embodiment of the present disclosure, and the flexible display module and the electronic device comprising the same will be explained as follows.

According to an embodiment of the present disclosure, a flexible printed circuit board comprises a flexible circuit film having a circuit layer disposed on one surface of a base film, and a ground pad portion disposed on another surface of the base film; and a conductive cover member configured to cover the other surface of the base film and electrically connected with the ground pad portion, wherein the conductive cover member includes a cutting portion overlapped with the ground pad portion.

According to one or more embodiments of the present disclosure, the cutting portion may include at least one cutting line overlapped with the ground pad portion.

According to one or more embodiments of the present disclosure, the cutting line may have a width of 0.5 mm or more than 0.5 mm.

According to one or more embodiments of the present disclosure, the flexible circuit film may further include a cover layer configured to cover the remaining portions of the other surface of the base film except the ground pad portion, wherein the boundary between the cover layer and the ground pad portion may be overlapped with the cutting portion.

According to one or more embodiments of the present disclosure, the ground pad portion may include at least one edge ground pad disposed in the edge portion of the other surface of the base film, the conductive cover member may be attached to the cover layer and the edge ground pad, and the boundary between the edge ground pad and the cover layer may be overlapped with the cutting portion.

According to one or more embodiments of the present disclosure, the conductive cover member may include a cover body attached to the cover layer; and a pad contact portion attached to the edge ground pad, wherein the pad contact portion is formed as a cantilever shape in the cover body by the cutting portion.

According to one or more embodiments of the present disclosure, the ground pad portion may include at least one island ground pad disposed in the remaining portions of the other surface of the base film except the edge portion, the conductive cover member may be attached to the cover layer and the island ground pad, and the boundary between the island ground pad and the cover layer may be overlapped with the cutting portion.

According to one or more embodiments of the present disclosure, the cutting portion may be overlapped with each corner portion of the island ground pad.

According to one or more embodiments of the present disclosure, the cutting portion may include at least one cutting line overlapped with at least one corner portion among corner portions of the island ground pad; and at least one cutting hole overlapped with the remaining corner portion among the corner portions of the island ground pad.

According to one or more embodiments of the present disclosure, the cutting line may have a width of 0.5 mm or more than 0.5 mm, and the cutting hole may have a diameter of 0.5 mm or more than 0.5 mm.

According to one or more embodiments of the present disclosure, the ground pad portion may include an island ground pad disposed in the remaining portions of the other surface of the base film except the edge portion, the conductive cover member may be attached to the cover layer and the island ground pad, and the cutting portion may include two cutting lines which are overlapped with the island ground pad and are configured to cross each other.

According to one or more embodiments of the present disclosure, the two cutting lines may have a planar structure of "x" shape or "+" shape.

According to one or more embodiments of the present disclosure, the ground pad portion may include an island ground pad disposed in the remaining portions of the other surface of the base film except the edge portion, and the conductive cover member may include a cover body attached to the cover layer; and a pad contact portion having a pad attachment portion which is connected in a cantilever shape with the cover body, and is attached to the island ground pad, wherein the cutting portion may be provided between the cover body and the pad attachment portion, and is overlapped with the boundary between the island ground pad and the cover layer.

According to one or more embodiments of the present disclosure, each of the island ground pad and the pad attachment portion may have a planar structure of a circular shape.

According to the embodiment of the present disclosure, a flexible display module comprises a flexible display panel having a display pad portion and a touch pad portion; and a display driving circuit portion having a flexible circuit board connected with the display pad portion, and a touch flexible circuit film connected with the touch pad portion, wherein at least one of the flexible circuit board and the touch flexible circuit film includes a flexible printed circuit board, wherein the flexible printed circuit board includes a flexible circuit film having a circuit layer disposed on one surface of a base film, and a ground pad portion disposed on the other surface of the base film; and a conductive cover member configured to cover the other surface of the base film and electrically connected with the ground pad portion, wherein the conductive cover member includes a cutting portion overlapped with the ground pad portion.

According to the embodiment of the present disclosure, an electronic device comprises a cover window; a flexible display module, connected with the cover window; and a display driving circuit portion connected with the flexible display module, wherein the flexible display module comprises a flexible display panel having a display pad portion and a touch pad portion; and a display driving circuit portion having a flexible circuit board connected with the display pad portion, and a touch flexible circuit film connected with the touch pad portion, wherein at least one of the flexible circuit board and the touch flexible circuit film includes a flexible printed circuit board, wherein the flexible printed circuit board includes a flexible circuit film having a circuit layer disposed on one surface of a base film, and a ground pad portion disposed on the other surface of the base film; and a conductive cover member configured to cover the other surface of the base film and electrically connected with the ground pad portion, wherein the conductive cover member includes a cutting portion overlapped with the ground pad portion.

In addition to the effects of the present disclosure as mentioned above, additional advantages and features of the present disclosure will be clearly understood by those skilled in the art from the above description of the present disclosure.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A flexible printed circuit board comprising:
    a flexible circuit film having a circuit layer disposed on one surface of a base film, and a ground pad portion disposed on another surface of the base film; and
    a conductive cover member configured to cover the other surface of the base film and electrically connected with the ground pad portion,
    wherein the conductive cover member includes a cutting portion overlapped with the ground pad portion,
    wherein the flexible circuit film includes a cover layer configured to cover remaining portions of the other surface of the base film except the ground pad portion,
    wherein the ground pad portion includes at least one edge ground pad disposed in an edge portion of the other surface of the base film,
    wherein the conductive cover member is attached to the cover layer and the edge ground pad, and
    wherein a boundary between the edge ground pad and the cover layer is overlapped with the cutting portion.

2. The flexible printed circuit board of claim 1, wherein the cutting portion has a width of 0.5 mm or more than 0.5 mm.

3. The flexible printed circuit board of claim 1, wherein the conductive cover member includes:
    a cover body attached to the cover layer; and
    a pad contact portion attached to the edge ground pad,
    wherein the pad contact portion is formed as a cantilever shape in the cover body by the cutting portion.

4. The flexible printed circuit board of claim 1,
    wherein the ground pad portion includes at least one island ground pad disposed in the remaining portions of the other surface of the base film except an edge portion,
    the conductive cover member is attached to the cover layer and the island ground pad, and
    a boundary between the island ground pad and the cover layer is overlapped with the cutting portion.

5. The flexible printed circuit board of claim 4, wherein the cutting portion is overlapped with each corner portion of the island ground pad.

6. The flexible printed circuit board of claim 4, wherein the cutting portion includes:
    at least one cutting line overlapped with at least one corner portions among corner portions of the island ground pad; and
    at least one cutting hole overlapped with the remaining corner portions among the corner portions of the island ground pad.

7. The flexible printed circuit board of claim 6, wherein the cutting line has a width of 0.5 mm or more than 0.5 mm, and
    the cutting hole has a diameter of 0.5 mm or more than 0.5 mm.

8. The flexible printed circuit board of claim 1, wherein the ground pad portion includes an island ground pad disposed on the remaining portions of the other surface of the base film except an edge portion,
    the conductive cover member is attached to the cover layer and the island ground pad, and
    the cutting portion includes two cutting lines which are overlapped with the island ground pad and are configured to cross each other.

9. The flexible printed circuit board of claim 8, wherein the two cutting lines have a planar shape of a "x" shape or a "+" shape.

10. The flexible printed circuit board of claim 1,
    wherein the ground pad portion includes an island ground pad disposed on the remaining portions of the other surface of the base film except an edge portion, and
    the conductive cover member includes:
    a cover body attached to the cover layer; and a pad contact portion having a pad attachment portion which is connected in a cantilever shape with the cover body, and is attached to the island ground pad, wherein the cutting portion is provided between the cover body and the pad attachment portion, and is overlapped with a boundary between the island ground pad and the cover layer.

11. The flexible printed circuit board of claim 10, wherein each of the island ground pad and the pad attachment portion has a planar shape of a circular shape.

12. A flexible display module comprising:
a flexible display panel having a display pad portion and a touch pad portion; and
a display driving circuit portion having a flexible circuit board connected with the display pad portion, and a touch flexible circuit film connected with the touch pad portion,
wherein at least one of the flexible circuit board and the touch flexible circuit film includes the flexible printed circuit board of claim 1.

13. The flexible display module of claim 12, wherein the cutting portion has a width of 0.5 mm or more than 0.5 mm.

14. An electronic device comprising:
a cover window;
the flexible display module of claim 12, connected with the cover window; and
a display driving circuit portion connected with the flexible display module.

* * * * *